(12) United States Patent
Izumi et al.

(10) Patent No.: US 12,156,404 B2
(45) Date of Patent: Nov. 26, 2024

(54) SEMICONDUCTOR DEVICE AND MANUFACTURING METHOD THEREOF

(71) Applicant: Kioxia Corporation, Tokyo (JP)

(72) Inventors: Takashi Izumi, Yokkaichi (JP);
Akitsugu Hatazaki, Yokkaichi (JP);
Shingo Nakajima, Yokkaichi (JP)

(73) Assignee: Kioxia Corporation, Tokyo (JP)

( * ) Notice: Subject to any disclaimer, the term of this patent is extended or adjusted under 35 U.S.C. 154(b) by 445 days.

(21) Appl. No.: 17/457,710

(22) Filed: Dec. 6, 2021

(65) Prior Publication Data
US 2022/0384466 A1 Dec. 1, 2022

(30) Foreign Application Priority Data
May 26, 2021 (JP) .................. 2021-088745

(51) Int. Cl.
*H10B 41/40* (2023.01)
*H01L 23/522* (2006.01)
*H10B 41/10* (2023.01)
*H10B 41/20* (2023.01)
*H10B 43/10* (2023.01)
*H10B 43/20* (2023.01)
*H10B 43/40* (2023.01)

(52) U.S. Cl.
CPC .......... *H10B 41/40* (2023.02); *H01L 23/5228* (2013.01); *H10B 41/10* (2023.02); *H10B 41/20* (2023.02); *H10B 43/10* (2023.02); *H10B 43/20* (2023.02); *H10B 43/40* (2023.02)

(58) Field of Classification Search
CPC ..... H01L 23/5228; H10B 41/40; H10B 43/27; H10B 43/40; H10B 43/50
See application file for complete search history.

(56) References Cited

U.S. PATENT DOCUMENTS

| 6,451,690 B1 | 9/2002 | Matsumoto et al. |
| 6,902,993 B2 | 6/2005 | Blosse et al. |
| 7,902,614 B2 | 3/2011 | Lim et al. |
| 2006/0244084 A1 | 11/2006 | Lee et al. |
| 2012/0161094 A1 | 6/2012 | Huo et al. |
| 2021/0287990 A1* | 9/2021 | Greenlee ........... H01L 21/76843 |

FOREIGN PATENT DOCUMENTS

| JP | 3247100 B2 | 1/2002 |
| JP | 2006-522481 A | 9/2006 |
| JP | 2008-166770 A | 7/2008 |

OTHER PUBLICATIONS

Gambino et al., "Reaction of Ti with WSi2", Journal of Applied Physics, vol. 82, No. 12, Dec. 15, 1997, pp. 6073-6077 (6 total pages).

* cited by examiner

*Primary Examiner* — Daniel P Shook
(74) *Attorney, Agent, or Firm* — Oblon, McClelland, Maier & Neustadt, L.L.P.

(57) ABSTRACT

A semiconductor device according to one embodiment includes: a semiconductor substrate; a peripheral circuit provided on the semiconductor substrate; and a stacked body provided above the peripheral circuit, which has a memory cell array. The peripheral circuit includes: a metal film including silicon; a silicide film stacked on the metal film; and a barrier metal film stacked on the silicide film.

14 Claims, 8 Drawing Sheets

SEMICONDUCTOR DEVICE AND MANUFACTURING METHOD THEREOF

CROSS-REFERENCE TO RELATED APPLICATIONS

This application is based upon and claims the benefit of priority from Japanese Patent Application No. 2021-088745, filed on May 26, 2021; the entire contents of which are incorporated herein by reference.

FIELD

Embodiments of the present invention relate to a semiconductor device and a manufacturing method thereof.

BACKGROUND

A NAND nonvolatile semiconductor storage device has been developed that includes a three dimensional memory array including memory cells three-dimensionally arranged thereon. In a known structure of such a semiconductor storage device, a peripheral circuit that controls the memory cell array is arranged below the memory cell array.

DETAILED DESCRIPTION

Embodiments will now be explained with reference to the accompanying drawings. The present invention is not limited to the embodiments.

A semiconductor device according to one embodiment includes a semiconductor substrate, a peripheral circuit provided on the semiconductor substrate, and a stacked body including a memory cell array, which is provided above the peripheral circuit. The peripheral circuit includes: a metal film including silicon; a silicide film stacked on the metal film; and a barrier metal film stacked on the silicide film.

First Embodiment

Figure 1:
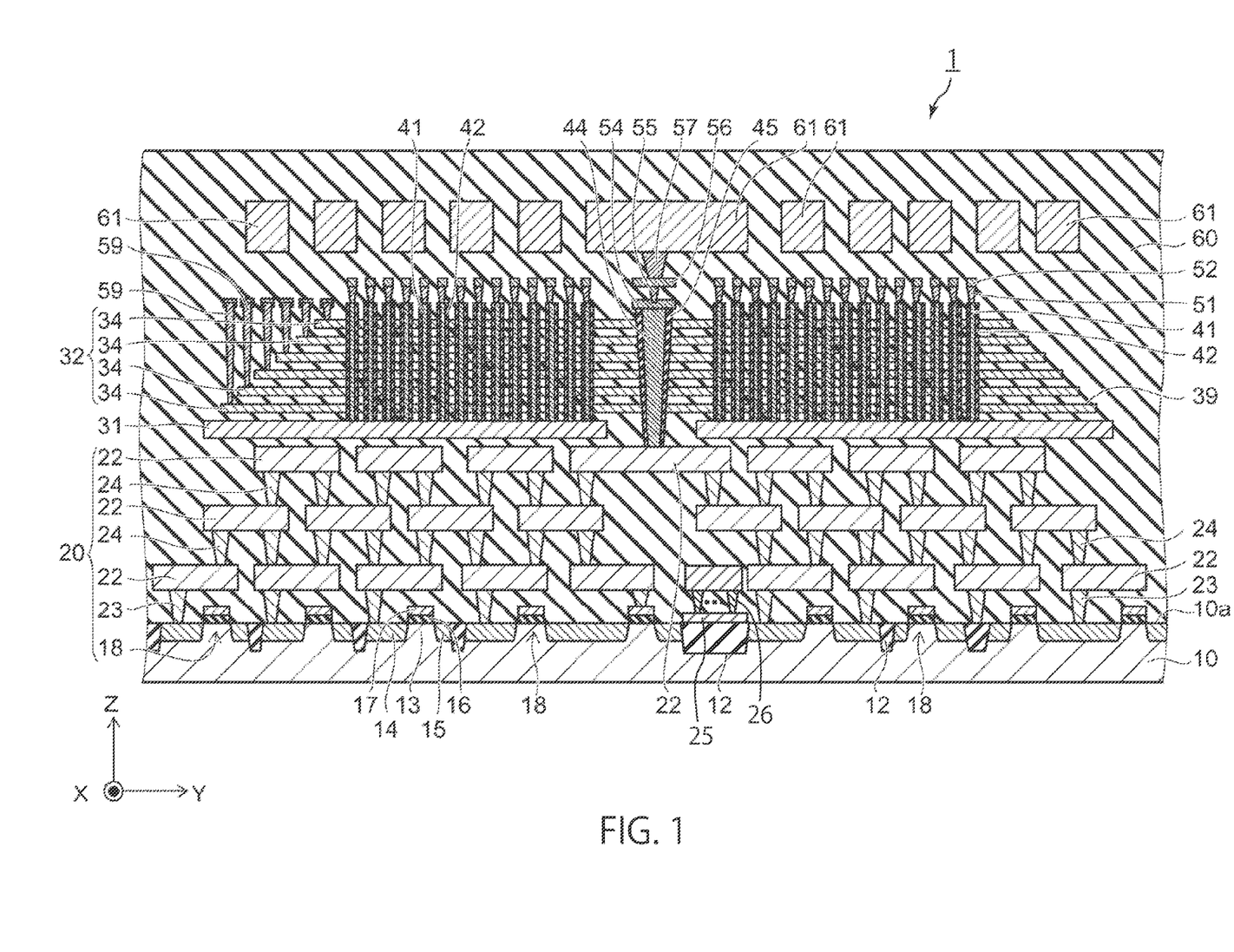
FIG. 1 is a cross-sectional view illustrating a structure of a semiconductor device according to a first embodiment.

FIG. 1 is a cross-sectional view illustrating a structure of a semiconductor device according to a first embodiment. A semiconductor device 1 according to this embodiment is a NAND nonvolatile semiconductor storage device including three-dimensionally structured memory cells, which can electrically freely erase and write data and retain stored contents even when power is turned off.

The semiconductor device 1 illustrated in FIG. 1 includes a semiconductor substrate 10, a peripheral circuit 20, and a stacked body 32. In the following description, two directions that are parallel to an upper face 10*a* of the semiconductor substrate 10 and are orthogonal to each other are assumed as X direction and Y direction. In addition, a direction perpendicular to the upper face 10*a* and orthogonal to the X direction and the Y direction is assumed as a Z direction. The Z direction is also a lamination direction of the stacked body 32.

The semiconductor substrate 10 is, for example, a silicon substrate. On an upper layer part of the semiconductor substrate 10, shallow trench isolation (STI: element isolation dielectric film) 12 is selectively provided. The STI 12 is formed of, for example, a silicon oxide film ($SiO_2$). On part of the STI 12, a resistive element 25 is provided. It should be noted that although only one resistive element 25 is illustrated in FIG. 1, a plurality of resistive elements 25 are provided in the semiconductor device 1. Here, the structure of each resistive element 25 is described with reference to FIG. 2A and FIG. 2B.

Figure 2A:
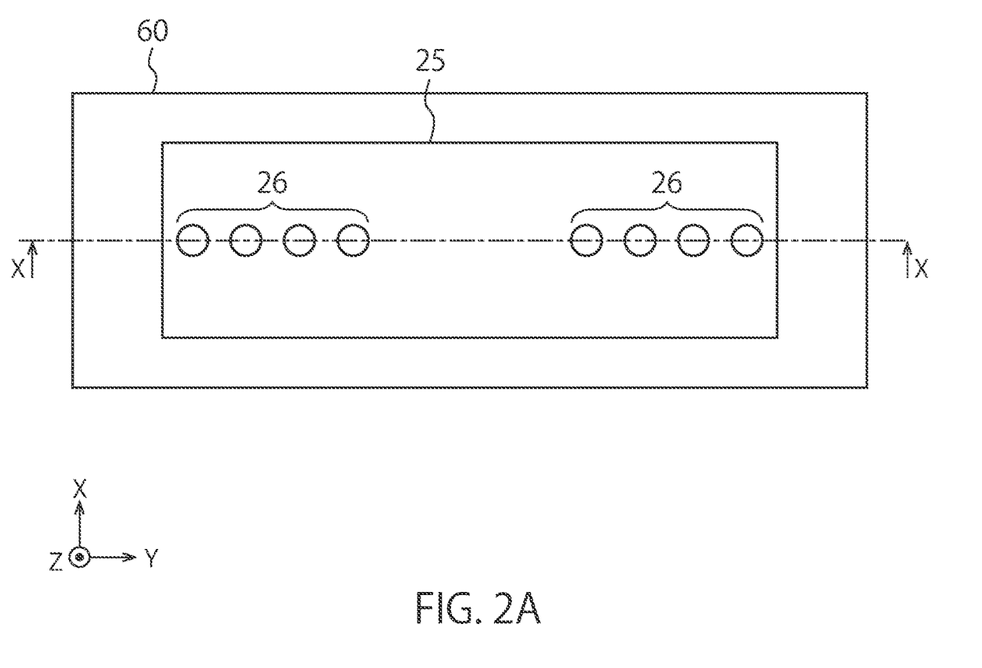
FIG. 2A is a plan view illustrating one example of a resistive element 25.
Figure 2B:
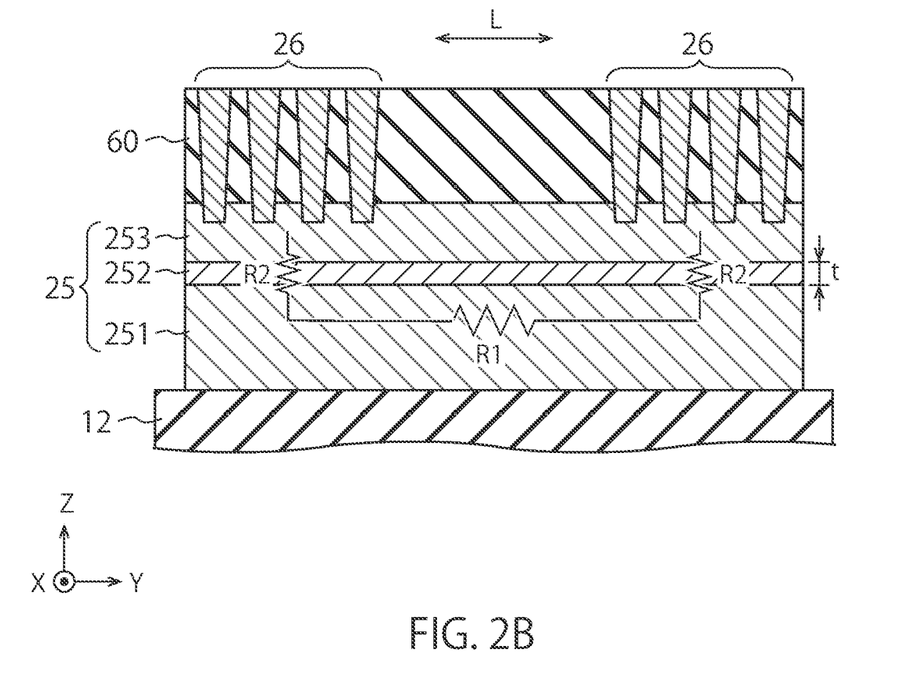
FIG. 2B is a cross-sectional view along a cutting line X-X illustrated in FIG. 2A.

FIG. 2A is a plan view illustrating one example of the resistive element 25. FIG. 2B is a cross-sectional view along a cutting line X-X illustrated in FIG. 2A. As illustrated in FIG. 2B, the resistive element 25 includes a metal film 251, a silicide film 252, and a barrier metal film 253.

The metal film 251 is provided on the STI 12. The metal film 251 is composed of, for example, a WSix including tungsten (W) and silicon (Si). In order to deposit silicon required to form the silicide film 252 while controlling the resistance value of the resistive element 25 to be equal to or lower than a specified value, it is preferable that the composition of tungsten and silicon, WSix, in the metal film 251 be in the range of $2<x<3$.

The silicide film 252 is stacked on the metal film 251. The silicide film 252 is composed of a compound obtained by silicidizing, for example, titanium (Ti) with silicon deposited from the metal film 251. The thickness "t" of the silicide film 252 is less than the thickness of the metal film 251 and is less than the thickness of the barrier metal film 253. Preferably, this thickness "t" is 1 nm or more and 3 nm or less in order to prevent titanium from peeling off from the metal film 251.

The barrier metal film 253 is stacked on the silicide film 252. The barrier metal film 253 is composed of, for example, titanium nitride (TiN) including titanium and nitrogen (N). To the barrier metal film 253, a plurality of contact plugs 26 are connected.

The plurality of contact plugs 26 are covered in an interlayer dielectric film 60. Although eight contact plugs 26 are illustrated in FIG. 2A and FIG. 2B, the number of contact plugs 26 is not particularly limited. Each contact plug 26 is composed of a conductor such as tungsten, for example. The value of current flowing through the contact plug 26 is adjusted according to the resistance value of the resistive element 25.

As for the resistance value of the resistive element 25, when the length "L" in the Y direction between contact plugs 26 is long, a resistance value "R1" in the Y direction of the metal film 251 is dominant. On the other hand, when the length "L" is short, the resistance value in the Z direction, that is, a resistance value "R2" that is obtained by adding an interface resistance between the metal film 251 and the silicide film 252 and an interface resistance between the silicide film 252 and the barrier metal film 253 together is dominant.

Here, referring back to FIG. 1, a plurality of semiconductor regions 13 are arranged in an upper layer region of the semiconductor substrate 10 which is adjacent to the resistive element 25. The plurality of semiconductor regions 13 are separated by the STI 12.

In at least part of the semiconductor regions 13, a source layer 14 and a drain layer 15 are formed. The source layer 14 and the drain layer 15 are examples of an impurity diffusion layer. In the semiconductor region 13, a gate insulating film 16 and a gate electrode 17 are provided. The gate insulating film 16, the gate electrode 17, the source layer 14, and the drain layer 15 constitute a transistor 18. The transistor 18 includes two different conductivity types of transistors: a p-type metal oxide semiconductor field effect transistor (MOSFET) and n-type MOSFET. The p-type MOSFET and n-type MOSFET constitute a complementary metal oxide semiconductor (CMOS) circuit. A current flowing through this CMOS circuit can also be adjusted by the resistive element 25.

When the transistor 18 is a p-type MOSFET, boron (B), for example, is included as an impurity in the source layer 14 and the drain layer 15. On the other hand, when the transistor 18 is an n-type MOSFET, arsenic (As) or phosphorus (P), for example, is included as an impurity in the source layer 14 and the drain layer 15.

The source layer 14 and the drain layer 15 have a contact plug 23 connected thereto. The contact plug 23 is connected to a via 24 through wiring 22 in the lowest layer. The peripheral circuit 20 includes transistors 18, wirings 22, contact plugs 23, vias 24, resistive elements 25, and contact plugs 26. The peripheral circuit 20 is, for example, a sense amplifier and is buried in the interlayer dielectric film 60.

Above wiring 22 in the uppermost layer among a plurality of layers of wiring 22, a buried source line 31 is provided. Each part of the buried source line 31 is supplied with voltage from the peripheral circuit 20. On the buried source line 31, the stacked body 32 is provided.

In the stacked body 32, channels 41 extend in the Z direction. Each channel 41 includes, for example, polysilicon and has a cylindrical shape with a closed lower end. The channel 41 is connected via a plug 51 to a bit line 52 that extends in the X direction.

In addition, in the stacked body 32, a through via 44 that extends in the Z direction is provided. A lower end of the through via 44 is connected to the wiring 22 in the uppermost layer in the peripheral circuit 20. The through via 44 is insulated from electrode films 34 by a dielectric film 45.

Above the through via 44, intermediate wiring 54, a plug 55, intermediate wiring 56, and a contact plug 57 are provided. On the contact plug 57, upper layer wiring 61 is provided. The through via 44 is connected to the upper layer wiring 61 via the intermediate wiring 54, the plug 55, the intermediate wiring 56, and the contact plug 57. A power supply potential or a signal potential is applied to the peripheral circuit 20 through the upper layer wiring 61 and the through via 44.

The buried source line 31, the stacked body 32, the plug 51, the bit line 52, the intermediate wiring 54, the plug 55, the intermediate wiring 56, the contact plug 57, a contact plug 59, and the upper layer wiring 61 are also buried in the interlayer dielectric film 60.

Figure 3:
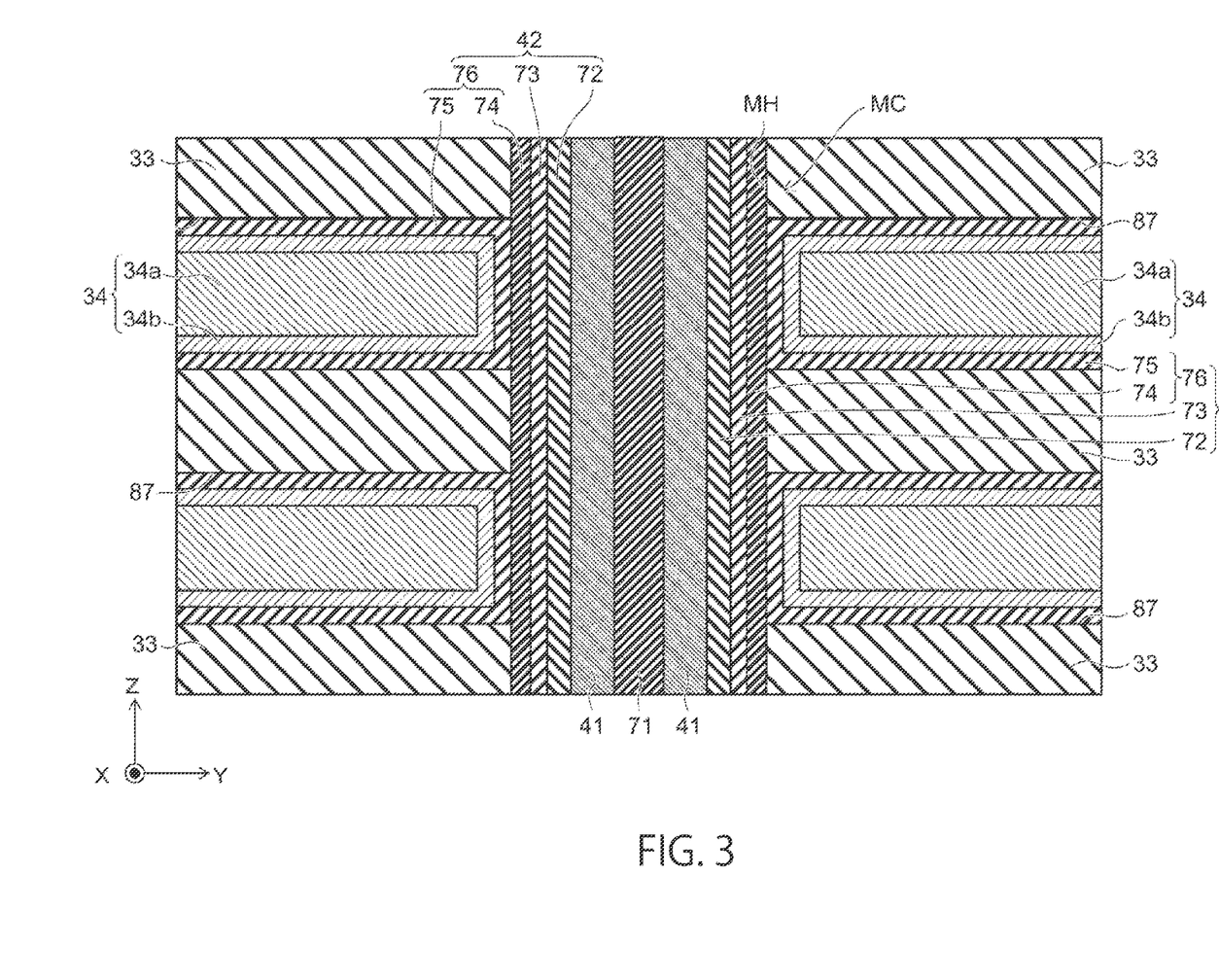
FIG. 3 is a cross-sectional view illustrating an internal structure of a stacked body.

FIG. 3 is a cross-sectional view illustrating an internal structure of the stacked body 32. In the stacked body 32, a plurality of dielectric films 33 and a plurality of electrode films 34 are alternately stacked in the Z direction. The dielectric film 33 includes, for example, silicon oxide. Each of the electrode films 34 includes: a main body 34a including, for example, tungsten; and a barrier metal film 34b including, for example, titanium nitride. The barrier metal film 34b covers an upper face and lower face of the main body 34a and a side face that faces the channel 41. Part of the electrode films 34 functions as a word line.

Between each electrode film 34 and each channel 41, a memory cell film 42 is provided. In addition, in the cylindrical channel 41, a core member 71 including silicon oxide, for example, is provided. The memory cell film 42 is formed of a tunnel dielectric film 72, a charge storage film 73, and a block dielectric film 76. An intersection of the electrode film 34 functioning as a word line and the memory cell film 42 forms a memory cell. In the stacked body 32, a plurality of memory cells are connected in series in the Z direction, forming a memory cell array.

The tunnel dielectric film 72 is provided on a side face of the channel 41. The tunnel dielectric film 72 includes, for example, silicon oxide. On a side face of the tunnel dielectric film 72, the charge storage film 73 with a cylindrical shape is provided. The charge storage film 73 includes, for example, silicon nitride. On a side surface of the charge storage film 73, a low dielectric constant layer 74 is provided. The low dielectric constant layer 74 includes, for example, silicon oxide.

In addition, on an upper face and lower face of the electrode film 34, and a side face thereof that faces the channel 41, a high dielectric constant layer 75 is provided. The high dielectric constant layer 75 includes a material whose dielectric constant is higher than the dielectric constant of a silicon oxide, for example, an aluminum oxide ($Al_2O_3$). The low dielectric constant layer 74 and the high dielectric constant layer 75 form a block dielectric film 76.

Hereinafter, a manufacturing method of the semiconductor device according to this embodiment will be described with reference to FIG. 4 to FIG. 6. It should be noted that here, a manufacturing process of the resistive element 25 illustrated in FIG. 2A and FIG. 2B will be described in detail. The resistive element 25 is manufactured after formation of the STI 12 and semiconductor region 13.

Figure 4:
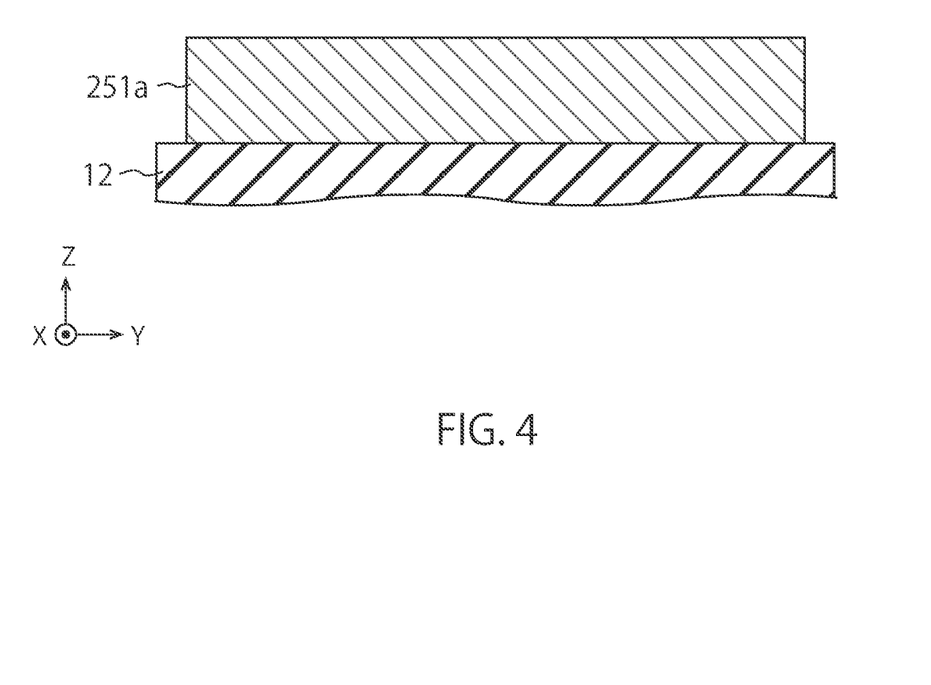
FIG. 4 is a cross-sectional view illustrating a process of forming a first metal film on an STI.

First, as illustrated in FIG. 4, a first metal film 251a is formed on the STI 12. The first metal film 251a can be formed, for example, by sputtering using WSi2.7 as a target material.

Figure 5:
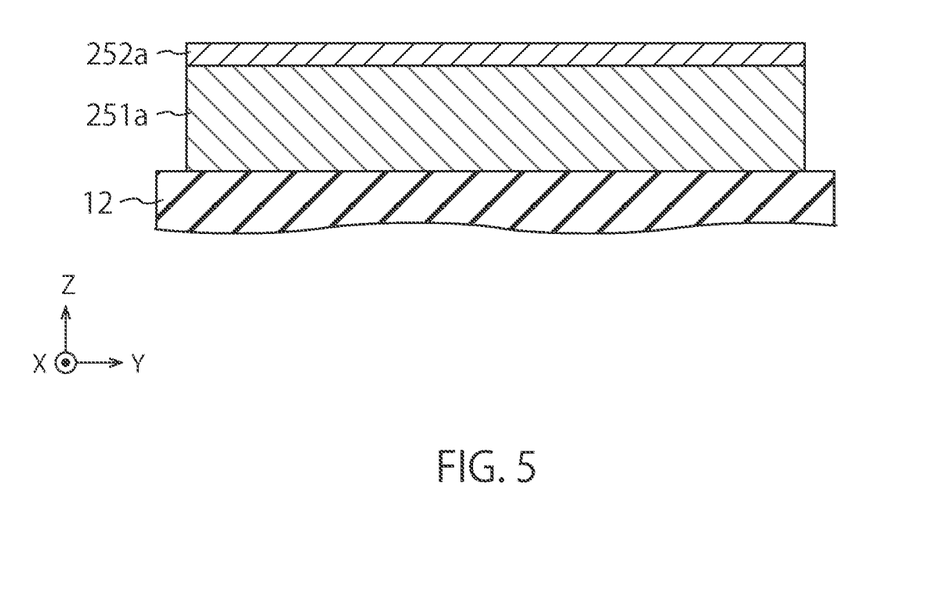
FIG. 5 is a cross-sectional view illustrating a process of forming a second metal film on the first metal film.

Next, as illustrated in FIG. 5, a second metal film 252a is formed on the first metal film 251a. The second metal film 252a can be formed, for example, by physical vapor deposition (PVD) using titanium as a vapor deposition material. It should be noted that the vapor deposition material is not limited to titanium but otherwise may be tungsten.

Figure 6:
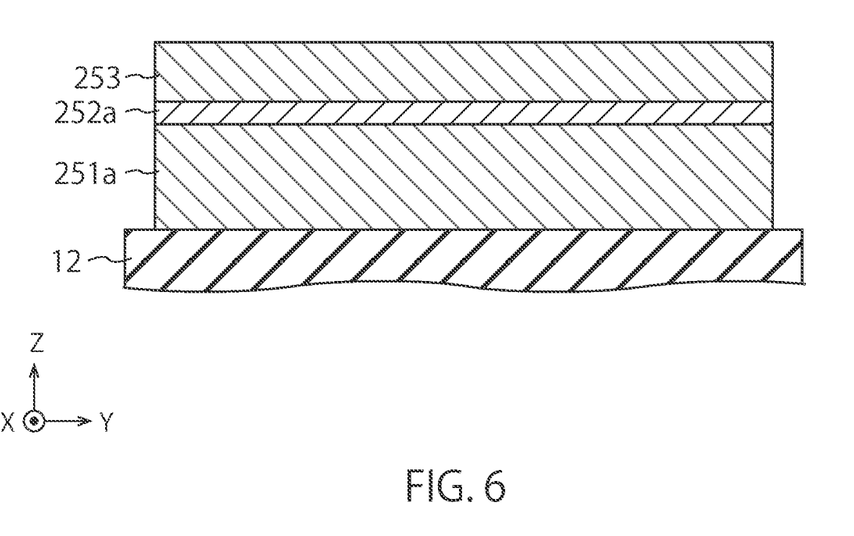
FIG. 6 is a cross-sectional view illustrating a process of forming a barrier metal film on the second metal film.

Next, as illustrated in FIG. 6, a barrier metal film 253 is formed on the second metal film 252a. The barrier metal film 253 can be formed, for example, by PVD using titanium nitride as a vapor deposition material.

Subsequently, wirings 22, contact plugs 23, vias 24, contact plugs 26, and the like are formed by commonly used methods; and then, the stacked body 32 is formed.

In forming the stacked body 32, several thermal processes are performed. For example, in forming the memory cell film 42, thermal process at 800 to 900° C. is performed. During this time, part of silicon included in the first metal film 251a is deposited. The deposited silicon chemically bonds with a metal (e.g., titanium) included in the second metal film 252a. As a result, the second metal film 252a changes to the silicide film 252 illustrated in FIG. 2B. Thus, the resistive element 25 is completed.

Figure 7:
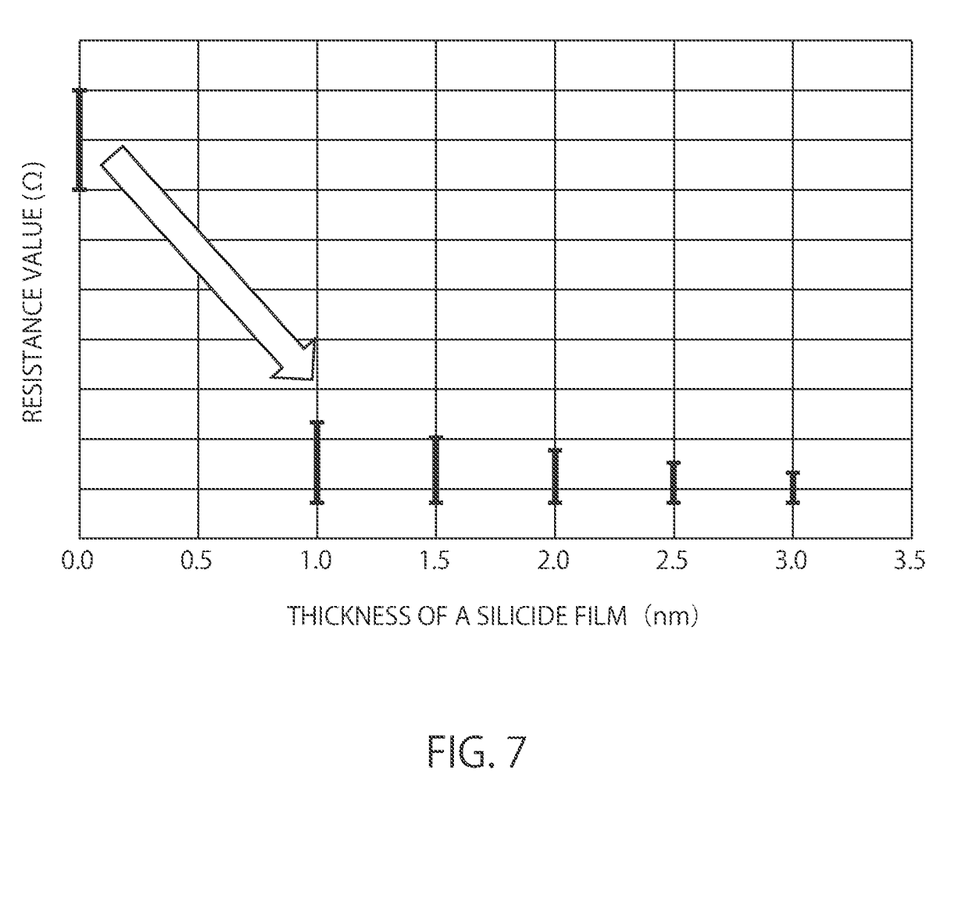
FIG. 7 is a graph illustrating a relationship between the thickness of a silicide film and the resistance value of the resistive element.

FIG. 7 is a graph illustrating a relationship between the thickness "t" of the silicide film 252 and the resistance value of the resistive element 25 (R1+R2). In FIG. 7, a horizontal axis indicates the thickness of the silicide film 252 and a vertical axis indicates the resistance value of the resistive element 25.

If the thickness "t" of the silicide film 252 is 0 nm, that is, the silicide film 252 is not formed between the metal film 251 and the barrier metal film 253, silicon is deposited from the metal film 251 due to thermal processes in forming the stacked body 32. In this case, the deposited silicon causes an increase in an interface resistance between the metal film 251 and the barrier metal film 253, making the resistance value of the resistive element 25 greater. Further, this causes larger variations in the resistance value.

On the other hand, when, as in this embodiment, the silicide film 252 including a thickness of 1 nm to 3 nm is formed between the metal film 251 and the barrier metal film 253, the resistance value of the resistive element 25 is reduced and further, variations in the resistance value are reduced. More specifically, as compared with the case of not forming the silicide film 252, the resistance value is reduced by 75% to 80% and variations in the resistance value are improved to be approximately one third thereof. This is because metal included in the second metal film 252a which has been formed in advance between the metal film 251 and the barrier metal film 253 is silicidized with silicon deposited from the metal film 251.

Thus, according to this embodiment, the silicide film 252 allows an improvement in the electric characteristic of the resistive element 25.

Second Embodiment

Figure 8:
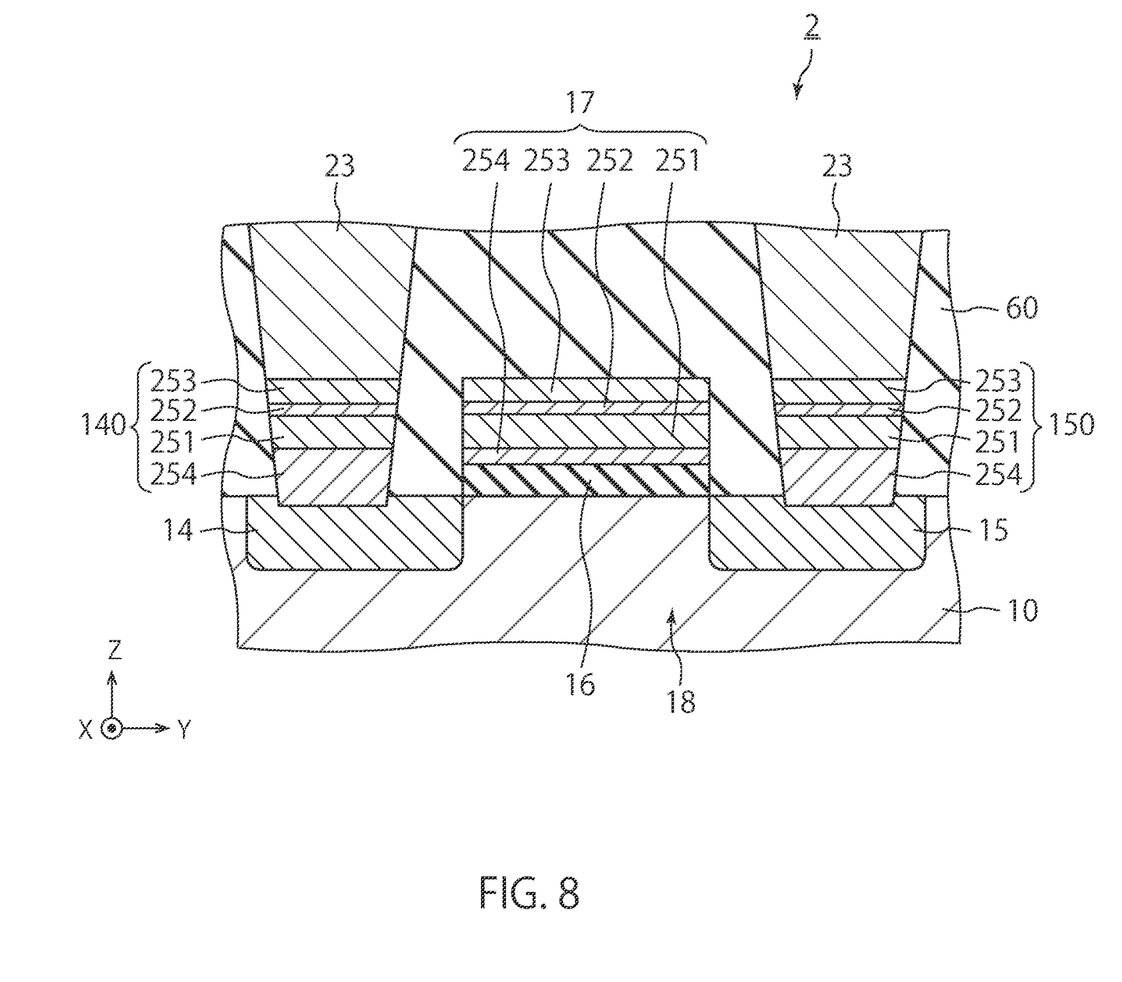
FIG. 8 is a cross-sectional view illustrating a structure of a main part of a semiconductor device according to a second embodiment.

FIG. 8 is a cross-sectional view illustrating a structure of a main part of a semiconductor device according to a second embodiment. The same components as those of the semiconductor device 1 according to the first embodiment described above are denoted by the same reference signs to omit detailed description.

In the semiconductor device 2 illustrated in FIG. 8, the gate electrode 17 of the transistor 18 includes a polysilicon film 254, a metal film 251, a silicide film 252, and a barrier metal film 253.

The polysilicon film 254 is formed on the gate insulating film 16. On the polysilicon film 254, the metal film 251 is formed. On the metal film 251, the silicide film 252 is formed. On the silicide film 252, the barrier metal film 253 is formed.

In addition, in the semiconductor device 2 according to this embodiment, a source electrode 140 is provided between a source layer 14 and a contact plug 23 and a drain electrode 150 is provided between a drain layer 15 and a contact plug 23. The source electrode 140 and the drain electrode 150 also have, as with the gate electrode 17, a stacked structure in which the polysilicon film 254, the metal film 251, the silicide film 252, and the barrier metal film 253 are stacked in this order from a bottom thereof.

The metal film 251, the silicide film 252, and the barrier metal film 253 that are provided in each of the gate electrode 17, the source electrode 140, and the drain electrode 150 can be formed simultaneously by using a deposition method similar to that for the resistive element 25 described in the first embodiment.

According to this embodiment, the silicide film 252 of each electrode is formed by silicidizing metal with silicon that is deposited from the metal film 251 by heat generated in forming the memory cell film 42. Therefore, the resistance values of the gate electrode 17, the source electrode 140, and the drain electrode 150 are reduced and variations in the resistance value of each electrode are also reduced. Thus, the electrical characteristics of the transistor 18 can be improved.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A semiconductor device, comprising:
   a semiconductor substrate;
   a peripheral circuit provided on the semiconductor substrate; and
   a stacked body including a memory cell array above the peripheral circuit;
   wherein the peripheral circuit includes:
   a metal film including silicon;
   a silicide film stacked on the metal film; and
   a barrier metal film stacked on the silicide film.

2. The semiconductor device according to claim 1, wherein
   a dielectric film is provided on a surface of the semiconductor substrate;
   a contact plug is provided on the barrier metal film; and
   the metal film is provided on the dielectric film and functions as a resistive element that adjusts current flowing through the contact plug.

3. The semiconductor device according to claim 2, wherein
   a semiconductor region is provided on a surface of the semiconductor substrate;
   the semiconductor region also includes:
   a source layer and a drain layer;
   a gate insulating film provided between the source layer and the drain layer; and
   a polysilicon film provided on each of the source layer, the drain layer, and the gate insulating film; and
   the metal film is provided on the polysilicon film and functions as a drain electrode, a source electrode, or a gate electrode.

4. The semiconductor device according to claim 3, wherein the semiconductor region is adjacent to the dielectric film.

5. The semiconductor device according to claim 1, wherein
   the metal film includes tungsten;
   the silicide film includes titanium and silicon; and
   the barrier metal film includes titanium and nitrogen.

6. The semiconductor device according to claim 5, wherein the silicide film has a thickness of 1 nm or more and 3 nm or less.

7. The semiconductor device according to claim 5, wherein in the metal film, a composition of the tungsten and the silicon, $WSi_x$, is in the range of $2<x<3$.

8. A manufacturing method of a semiconductor device, the semiconductor device including a semiconductor substrate, a peripheral circuit provided on the semiconductor substrate, and a stacked body including a memory cell array, the stacked body being provided above the peripheral circuit, the manufacturing method comprising:
- forming a first metal film including silicon on the semiconductor substrate;
- forming a second metal film on the first metal film;
- forming a barrier metal film on the second metal film; and
- changing the second metal film to a silicide film using heat generated in a process after forming the barrier metal film.

9. The manufacturing method of the semiconductor device according to claim 8, wherein in the process after forming the barrier metal film, the memory cell array is formed.

10. The manufacturing method of the semiconductor device according to claim 8, wherein the heat is within a range of 800 to 900° C.

11. The manufacturing method of the semiconductor device according to claim 8, comprising:
- forming a dielectric film on a surface of the semiconductor substrate;
- forming the first metal film on the dielectric film; and
- forming a contact plug on the barrier metal film.

12. The manufacturing method of the semiconductor device according to claim 8, comprising:
- forming a source layer and a drain layer on a surface of the semiconductor substrate;
- forming a gate insulating film between the source layer and the drain layer;
- forming a polysilicon film on the source layer, the drain layer, and the gate insulating film; and
- forming the first metal film on the polysilicon film.

13. The manufacturing method of the semiconductor device according to claim 12, wherein the silicide film has a thickness of 1 nm or more and 3 nm or less.

14. The manufacturing method of the semiconductor device according to claim 8, wherein
- the first metal film includes tungsten;
- the second metal film includes titanium; and
- the barrier metal film includes titanium and nitrogen.

* * * * *